US012306246B2

(12) United States Patent
Jain et al.

(10) Patent No.: US 12,306,246 B2
(45) Date of Patent: May 20, 2025

(54) PARTIAL CHAIN RECONFIGURATION FOR TEST TIME REDUCTION

(71) Applicant: STMicroelectronics International N.V., Geneva (CH)

(72) Inventors: Sandeep Jain, Noida (IN); Shalini Pathak, Gurgaon (IN)

(73) Assignee: STMicroelectronics International N.V., Geneva (CH)

( * ) Notice: Subject to any disclaimer, the term of this patent is extended or adjusted under 35 U.S.C. 154(b) by 11 days.

(21) Appl. No.: 18/453,045

(22) Filed: Aug. 21, 2023

(65) Prior Publication Data

US 2025/0067803 A1    Feb. 27, 2025

(51) Int. Cl.
*G01R 31/00* (2006.01)
*G01R 31/3177* (2006.01)

(52) U.S. Cl.
CPC ................. *G01R 31/3177* (2013.01)

(58) Field of Classification Search
CPC .... G01R 31/318536; G01R 31/318583; G01R 31/31813; G01R 31/3167; G01R 31/31707; G01R 31/31713; G01R 31/31715; G01R 31/31716; G01R 31/31717; G01R 31/3177
See application file for complete search history.

(56) References Cited

U.S. PATENT DOCUMENTS

| 6,615,380 | B1 | 9/2003 | Kapur |
| RE41,187 | E | 3/2010 | Cooke |
| 8,214,704 | B1 * | 7/2012 | Bertanzetti .... G01R 31/318547 714/732 |
| 9,606,180 | B2 | 3/2017 | Bahl |
| 11,041,906 | B2 * | 6/2021 | Huang ........... G01R 31/318569 |
| 11,073,556 | B2 * | 7/2021 | Cheng .................. G06F 30/333 |
| 11,092,645 | B2 * | 8/2021 | Cheng .............. G01R 31/31725 |
| 11,156,661 | B2 * | 10/2021 | Cheng ................ G01R 31/3177 |
| 11,408,938 | B2 * | 8/2022 | Cheng ........... G01R 31/318555 |
| 2005/0166108 | A1 | 7/2005 | Huisman |
| 2013/0103994 | A1 | 4/2013 | Tekumalla |
| 2013/0185607 | A1 | 7/2013 | Tekumalla |
| 2014/0372821 | A1 | 12/2014 | Rajski |
| 2016/0266202 | A1 | 9/2016 | Mittal |
| 2018/0335475 | A1 | 11/2018 | Danialy |
| 2019/0011500 | A1 | 1/2019 | Shah |

(Continued)

OTHER PUBLICATIONS

Extended European Search Report, EP Application No. 24192884.5, mailed Jan. 21, 2025, 12 pages.

*Primary Examiner* — Esaw T Abraham
(74) *Attorney, Agent, or Firm* — Slater Matsil, LLP (57) ABSTRACT

According to an embodiment, a first aspect relates to a method for testing a scan chain. The method includes segmenting the scan chain into two or more segments; adding a respective multiplexer at end points of each segment, wherein each pair of sequential segment shares a common multiplexer in between; asserting a select signal at a select terminal of the multiplexers such that a relative position of the two or more segments is rearranged positionally in a rearranged scan chain; generating a test pattern to be communicated to an input terminal of the rearranged scan chain and observing a test result at an output of the rearranged scan chain; and determining a fault condition in the rearranged scan chain based on comparing the test result and an expected result.

20 Claims, 9 Drawing Sheets

(56) References Cited

U.S. PATENT DOCUMENTS

| | | |
|---|---|---|
| 2019/0369162 A1 | 12/2019 | Londhe |
| 2020/0327268 A1 | 10/2020 | Mukherjee |
| 2020/0341057 A1 | 10/2020 | Cheng |
| 2022/0043062 A1 | 2/2022 | Cheng |

* cited by examiner

- PRIOR ART -

PARTIAL CHAIN RECONFIGURATION FOR TEST TIME REDUCTION

TECHNICAL FIELD

The present disclosure generally relates to design for testing (DFT) and, in particular embodiments, to partial scan chain reconfiguration for test time reduction.

BACKGROUND

Design for testing (DFT) is used in digital logic design to ensure that integrated circuits (ICs) can be effectively tested for functionality and manufacturing defects. DFT techniques aim to simplify and enhance the testability of ICs, reducing the time and resources required for testing.

Scan chains are a widely used DFT technique that enables efficient testing of ICs. In a scan chain, additional flip-flops, known as scan flops, are inserted into the sequential elements of the design. These scan flops form a shift register that allows the capture and observation of the internal states of the design. Scan chains enable efficient testing of complex sequential circuits by serially shifting in test patterns and observing the corresponding outputs. This technique improves testability by providing controllability and observability of internal nodes, allowing for easy identification of faulty components.

Scan compression techniques reduce the test data required to test large, complex designs. As ICs grow in complexity, the amount of test data needed to achieve high fault coverage increases significantly, resulting in longer test times and higher costs. Scan compression techniques address this challenge by compressing the test data and reducing the storage and bandwidth requirements during testing.

Figure 1:
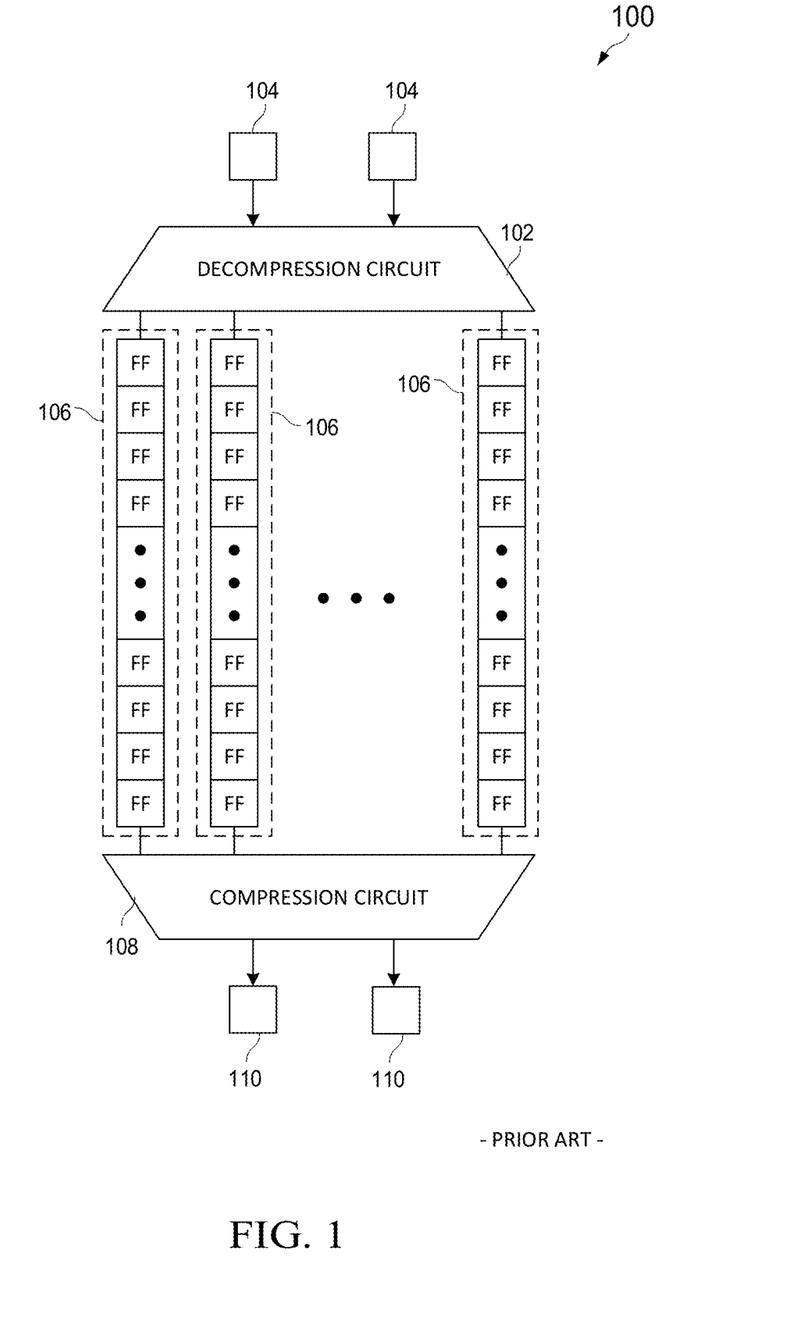
FIG. 1 is an example of a conventional scan compression architecture.

FIG. 1 illustrates an example of a conventional scan compression architecture 100. In the scan compression architecture, a decompression circuit 102 (i.e., decompressor) and a compression circuit 108 (i.e., compressor) work together to reduce the test data required during testing and then expand it back to its original form for analysis. By using the decompression circuit 102 and the compression circuit 108, the volume of test data required for testing large and complex designs is significantly reduced. This reduction in test data size leads to faster testing times, reduced storage requirements, and improved efficiency in fault detection without sacrificing fault coverage.

Decompression circuit 102 receives test input data from limited primary inputs 104. The decompression circuit 102 expands the test input data to be fed to the scan chains 106 of the integrated circuit. Compression circuit 108 reduces the size of the output data by encoding the test patterns in a more compact representation. Compression circuit 108 receives the resulting output from the scan chains 106 and compresses the data to be observed at limited externally accessible pins 110.

A "care" bit or a "controlling" bit is a bit or signal whose value is critical to the correct operation of the circuit under test. It represents a signal that needs to be correctly propagated and processed for the circuit under test to function as intended. During fault detection, care bits create the right conditions to trigger fault in a faulty circuit and enable it to be observed and monitored.

On the other hand, a "no-care" bit is a bit or signal whose value is not crucial for the correct circuit operation. It represents a signal that can have arbitrary or don't-care values without affecting the overall functionality of the circuit. No-care bits are typically used to reduce the complexity of the testing process by allowing flexibility in the values they can take during testing.

Don't care bits are often excluded from the fault detection process during fault detection. Since their values do not target the circuit's behavior, potential faults related to these bits are considered non-critical and do not require investigation. Ignoring the testing of no-care bits helps to simplify the testing process and reduce the number of test patterns needed to achieve high fault coverage.

Identifying care and no-care bits is typically performed during the test generation phase, where algorithms and techniques are used to analyze the circuit and determine the significance of each bit or signal. This information is then utilized during the fault detection phase to focus the testing efforts on the critical parts of the circuit while disregarding the non-critical ones.

Generally, decompression circuit 102 utilizes mathematical equations, such as Linear Feedback Shift Registers (LFSRs), as part of its functionality. LFSRs are commonly employed in scan compression architectures to generate and manipulate compressed test patterns. Mathematical equations, particularly LFSRs, provide a deterministic and efficient method for generating and manipulating compressed and uncompressed test patterns. By carefully configuring the LFSRs and coordinating their operations within the decompression circuit 102, the original test patterns can be accurately reconstructed, enabling the proper testing and fault detection of the circuit under test.

In certain situations, the care bits are clustered within a few flip-flops in the same or adjacent cycle, which can become challenging for decompression circuit 102. In other words, clustering the care bits within a few flip-flops can complicate the mathematical equation to be solved by the decompression circuit 102. If solving the equation becomes inefficient, the test tool can drop certain faults from the test or generate inefficient test patterns, resulting in test pattern inflation or a significant increase in test patterns. It is, thus, desirable to have an improved scan compression architecture that does not suffer from the deficiencies of conventional solutions.

SUMMARY

Technical advantages are generally achieved by embodiments of this disclosure which describe partial scan chain reconfiguration for test time reduction.

According to an embodiment, a first aspect relates to a method for testing a scan chain. The method includes segmenting the scan chain into two or more segments; adding a respective multiplexer at end points of each segment, wherein each pair of sequential segment shares a common multiplexer in between; asserting a select signal at a select terminal of the multiplexers such that a relative position of the two or more segments is rearranged positionally in a rearranged scan chain; generating a test pattern to be communicated to an input terminal of the rearranged scan chain and observing a test result at an output of the rearranged scan chain; and determining a fault condition in the rearranged scan chain based on comparing the test result and an expected result.

A second aspect relates to a scan chain that includes a plurality of sequential segments and a plurality of multiplexers. Each multiplexer is arranged at the end points of each segment. Each pair of sequential segment shares a common multiplexer in between. Each multiplexer is configured to receive a select signal such that the relative position of each sequential segment is rearranged positionally in a rearranged scan chain. A test pattern is fed to an input terminal of the rearranged scan chain and a test result is observed at an output of the rearranged scan chain. A fault condition is determined in the rearranged scan chain based on a comparison between the test result and an expected result.

A third aspect relates to a test system. The test system includes a plurality of scan chains. Each alternate scan chain in the plurality of scan chains includes a plurality of sequential segments and a plurality of multiplexers. Each multiplexer is arranged at the end points of each segment. Each pair of sequential segment shares a common multiplexer in between. Each multiplexer is configured to receive a select signal such that the relative position of each sequential segment is rearranged positionally in a rearranged scan chain. A test pattern is fed to an input terminal of the rearranged scan chain and a test result is observed at an output of the rearranged scan chain. A fault condition is determined in the rearranged scan chain based on a comparison between the test result and an expected result.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of design for testing (DFT), it should also be appreciated that these inventive aspects may also apply to other aspects of circuit design. Embodiments of this disclosure apply to combinational and sequential compressions and may be applied to factory testing using, for example, an automatic test pattern generation (ATPG) tool or in-field testing using, for example, a logic built-in self-test (LBIST) controller.

A system and method are proposed in embodiments that allow the compression tools to resolve controllability and observability equations while minimizing overhead and increasing design flexibility. Advantageously, the test pattern count is reduced, test coverage is increased, and test time is decreased. Further, no invasive test point insertions are required to implement the embodiments disclosed. In embodiments, a subset of scan chains with common decompression and compression circuits are reconfigured by spreading the care bits across the time domain. These and other details are further detailed below.

Figure 2:
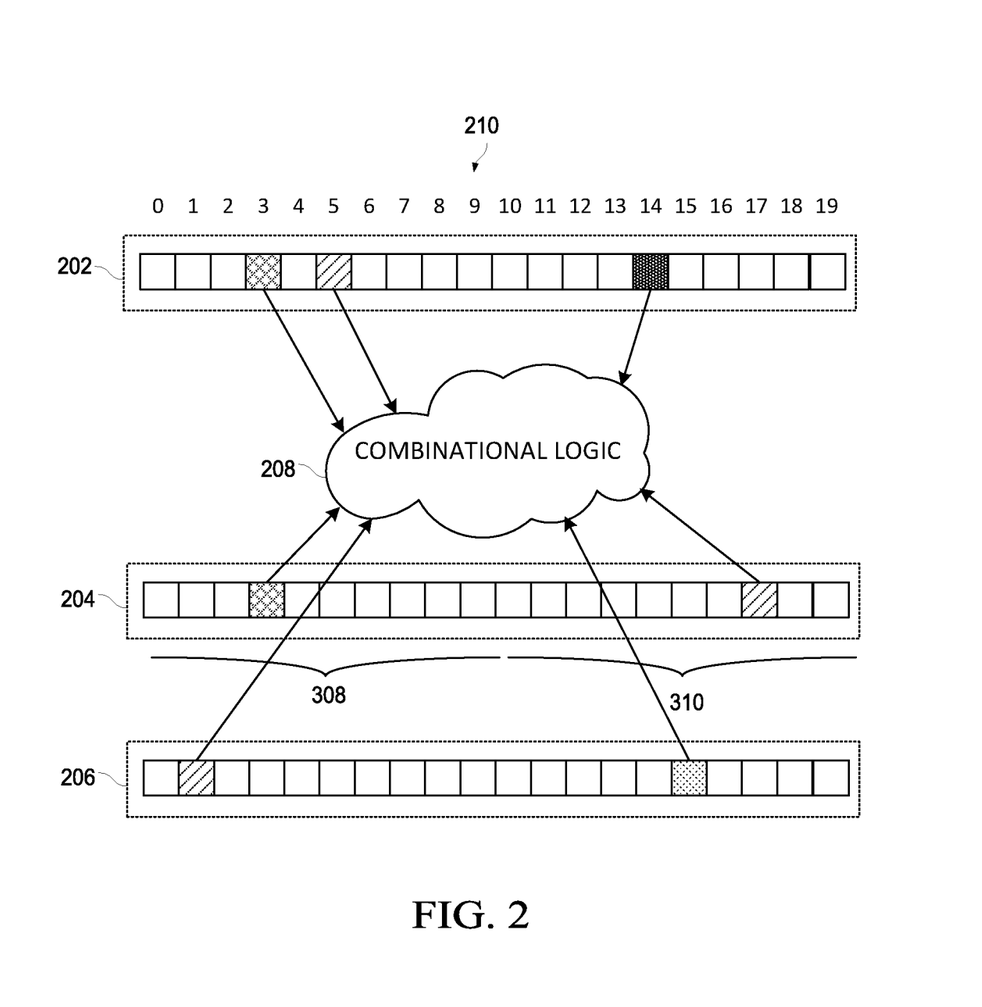
FIG. 2 is an example of a cycle-by-cycle operation for multiple scan chains coupled to a common combinational logic.

FIG. 2 illustrates an example of a cycle-by-cycle operation for multiple scan chains 202, 204, 206 coupled to a common combinational logic 208. As shown, only three scan chains: a first scan chain 202, a second scan chain 204, and a third scan chain 206, are shown in FIG. 2. It should be appreciated that the number of scan chains is non-limiting.

Combinational logic 208 represents a logic circuit that produces outputs based on the current inputs. Unlike sequential logic, which depends on the current inputs and the past state, combinational logic 208 has no memory or feedback, making its behavior entirely determined by the present input values.

Combinational logic 208 can be constructed by interconnecting basic logic gates to perform more complex operations. Combinational logic 208 may include one or more logic gates, such as AND, OR, NOT, NAND, NOR, and XOR. These gates take one or more input signals and produce a single output signal based on the logical operation specified by the gate. Combinational logic 208 can be used in various digital systems, including arithmetic circuits (e.g., adders, subtractors), multiplexers, demultiplexers, encoders, decoders, and many other applications.

When a circuit is in scan mode, the functional operation of the design is paused, the scan chain is activated, and a test pattern is applied. During shift cycles, the test pattern bits are serially shifted into the scan chain, loading the test pattern into the internal flip-flops. Typically, after the shift-in process, the circuit is switched back to "functional mode," where the test pattern is propagated through the, for example, combinational logic 208 and sequential elements. To observe the circuit's response to the test pattern, the circuit is again switched to "scan mode" during shift cycles. The output response is then serially shifted out of the scan chain for analysis. At each cycle of shift cycle 210, a complete test pattern is shifted in or out through each scan chain 202, 204, 206. The number of shift cycles depends on the length of the scan chain 202, 204, 206, which, in turn, depends on the number of flip-flops inserted in the design for scan testing of each scan chain 202, 204, 206.

Depending on the operation of the scan chain, during various shift cycles 210, a flip-flop of the scan chain 202, 204, 206 may provide an input to the combinational logic

208. In FIG. 2, the shift cycle for a representative scan chain providing an input to the combinational logic 208 is denoted as a hashed scan cell. In the example of FIG. 2, the first scan chain 202 provides an input to drive the combinational logic 208 at shift cycles three, five, and fourteen, second scan chain 204 provides an input to drive the combinational logic 208 at shift cycles three and seventeen, and scan chain 206 provides an input to drive the combinational logic 208 at shift cycles one and fifteen.

Thus, in the example of FIG. 2, the first scan chain 202 and the second scan chain 204 drive the combinational logic 208 at the same third shift cycle, and the first scan chain 202 and the third scan chain 204 drive the combinational logic 208 at adjacent shift cycles of fourteen and fifteen.

Herein, "combinational depth" refers to the longest path of logic gates a signal must traverse from its inputs to its output within a combinational logic circuit. Combinational depth determines the maximum propagation delay of a circuit and affects its overall performance. Generally, combinational depth directly impacts the circuit's speed, representing the worst-case time delay for a signal to propagate through the combinational logic and produce an output. In embodiments where the combinational logic 208 has a high combinational depth, the test coverage may suffer; in particular when the scan chains drive the combinational logic 208 at the same or adjacent shift cycles.

In the example of FIG. 2, the first scan chain 202, the second scan chain 204, and the third scan chain 26 drive the same combinational logic 208 and are configured as three adjacent scan chains.

Generally, in normal scan stitching, the test tool places related flip-flops driving the same combinational logic into a single scan chain or two or three adjacent scan chains, depending on the associated combinational depth. The care bits for these adjacent scan chains are positioned at similar positions, so they drive the same combinational logic 208 at the same shift cycle.

Aspects of this disclosure advantageously solve this problem by spreading the care bits across the time domain. In embodiments, time domain spacing is used to rearrange one or more care bits by rearranging the scan chain. In some embodiments, alternate scan chains are reconfigured to spread the care bit. In embodiments, test patterns are generated for the original and modified scan chain configurations. Combining these test patterns increases test coverage for hard-to-detect faults while decreasing the overall test pattern count.

Advantageously, the direction of the test pattern insertion remains the same (i.e., retaining the scan direction) and is not reversed. Likewise, the scan chain length is not modified in the embodiments of this disclosure. The shift ordering is reconfigured in several scan chains to reduce test time and minimize test patterns. Further, no additional compression engines are required in implementing the disclosed embodiments (e.g., different scan chains are not reconfigured with different compression ratios).

This disclosure's embodiments do not impact functional paths, require minimal routing changes, increase test scan coverage with reduced test pattern counts, reduce test time, and can be extended to any compressed or LBIST design.

Figure 3:
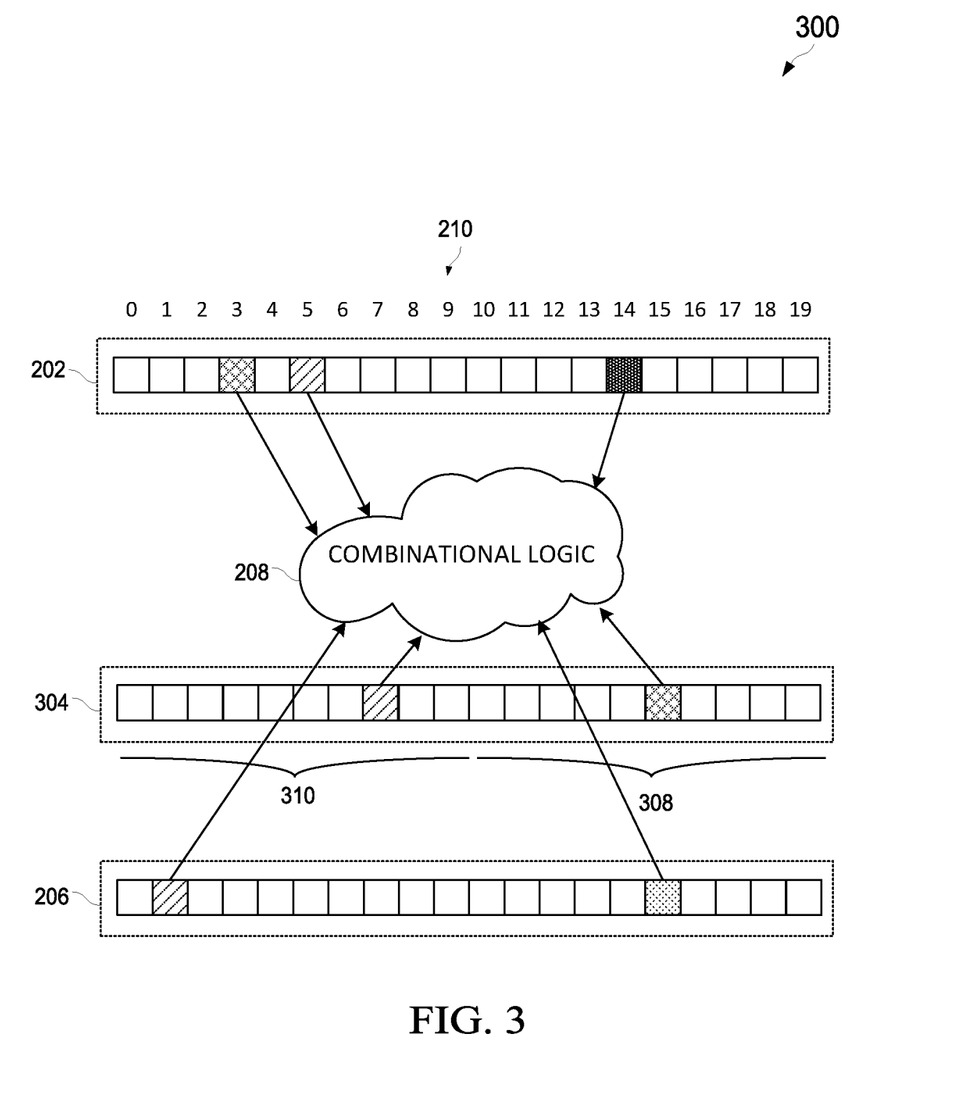
FIG. 3 is an example of a cycle-by-cycle operation for multiple scan chains coupled to a common combinational logic with time domain spacing.

FIG. 3 illustrates an example of a cycle-by-cycle operation for multiple scan chains 202, 304, 206 coupled to the common combinational logic 208 with time domain spacing. The first scan chain 202 and the third scan chain 206 remain in the original arrangement as in FIG. 2, whereas the second scan chain 304 is a reconfigured scan chain arrangement of the second scan chain 204 in FIG. 2.

In some embodiments, where the number of scan chains equals N, every odd number scan chain remains unchanged, and every even number scan chain is reconfigured. In some embodiments, every odd number scan chain is reconfigured, and every even number scan chain remains unchanged. It is noted that the selection of the scan chains to be reconfigured is non-limiting, and any arrangement is contemplated in embodiments.

The selective (non-universal) reconfiguring of the scan chains (e.g., alternate scan chain selection) allows for the relative positioning of the care bits to be spread across the scan chain; otherwise, the relative positioning can result in the care bits remaining the same relative to each other (e.g., reconfiguring both the first scan chain 202 and the second scan chain 204).

In embodiments, the second scan chain 204 is first divided into a first segment 308 and a second segment 310. In embodiments, the first segment 308 and the second segment 310 are sequential. In embodiments, the first segment 308 and the second segment 310 cover the entire scan chain of the second scan chain 204.

The second scan chain 304, is a rearrangement of the second scan chain 204, where the placement of the first segment 308 is switched (i.e., swapped) with the placement of the second segment 310. Thus, where the second scan chain 204 included the first segment 308 followed by the second segment 310, the second scan chain 304 includes the second segment 310 followed by the first segment 308. Likewise, where more than three scan chains are used, the scan chains selected to be reconfigured are rearranged by segmenting the scan chain into a first segment and a second segment and rearranging the position of the segments.

The rearrangement of the second scan chain 304 (i.e., segmentation and swapping of the position of the segments) in reference to the second chain 204 corresponds to the change in the position of flip-flops in the second scan chain 304 and the spreading of the care-bits across the time domain. As such, whereas before, the first scan chain 202 and the second scan chain 204 drove the combinational logic 208 at the same third shift cycle, in the rearranged second scan chain 304, the first scan chain 202 and the second scan chain 304 drive the combinational logic 208 at different shift cycles (i.e., the care bits are not at the same cycle for different scan chains), which helps the test tool to efficiently generate the test patterns.

In embodiments, the first segment 308 and the second segment 310 are arranged to have the same number of flip-flops (i.e., halfway point). In other embodiments, the first segment 308 and the second segment 310 are arranged to have a different number of flip-flops (i.e., the point to segment is skewed toward the start or end points of the scan chain).

Figure 4:
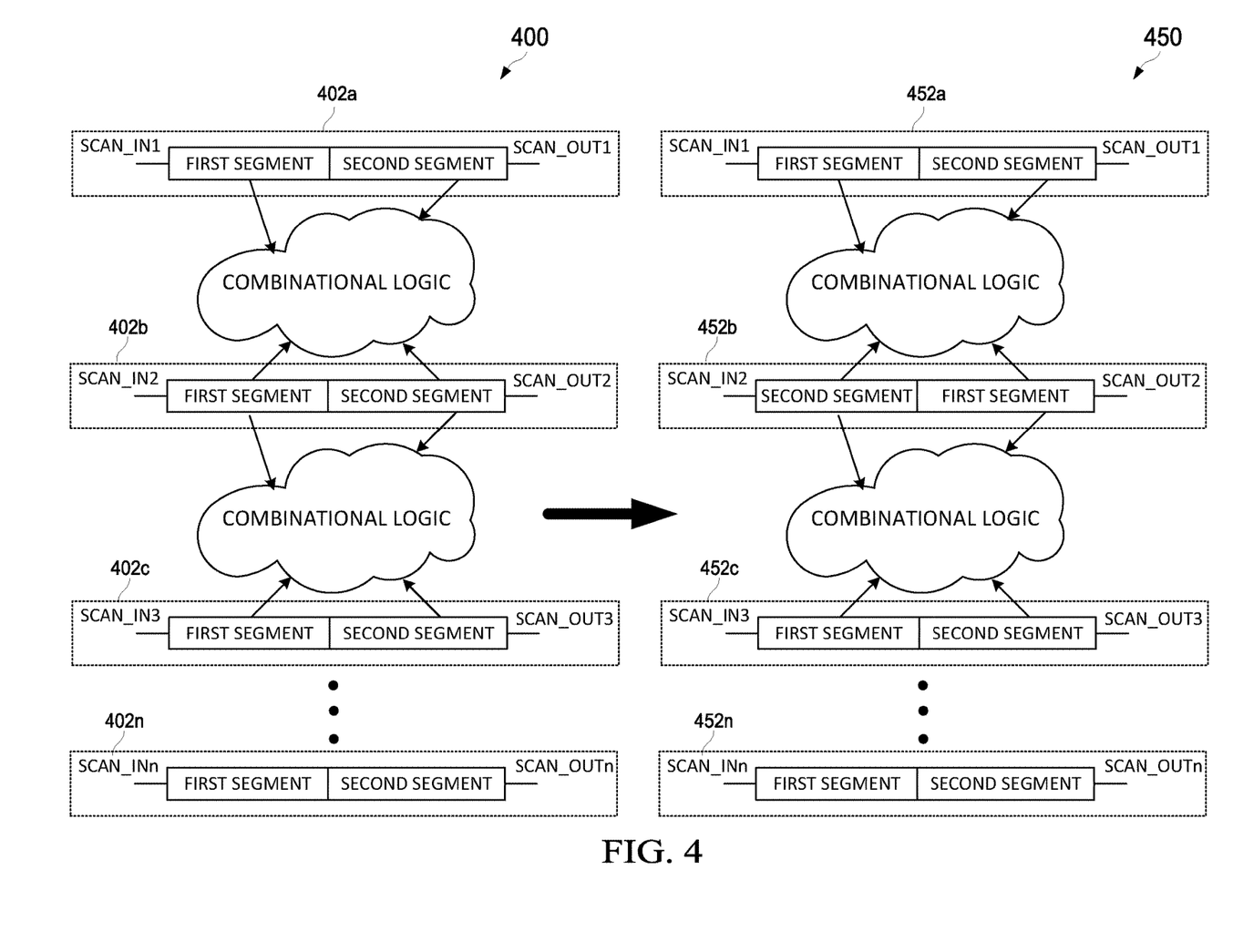
FIG. 4 is an example of a cycle-by-cycle operation for N number of scan chains coupled to a common combinational logic with and without time domain spacing.

FIG. 4 illustrates an example of a cycle-by-cycle operation for N number of scan chains coupled to the common combinational logic 208 with and without time domain spacing. The first set of scan chains 400 includes N number of scan chains 402a, 402b, 402c, . . . , and 402n. The second set of scan chains 450 includes N number of scan chains 402a, 452b, 402c, . . . , and 402n—here, N is assumed to be an odd number.

In the example of FIG. 4, the second set of scan chains 450 includes scan chains that are reconfigured arrangements of a subset of the first set of scan chains 400 (e.g., scan chain 452b is a rearranged scan chain 402b). In the second scan chain 450, each alternate scan chain (here, even number) in the first scan chain 400 is (i) segmented into first and second segments and (ii) swapped in position (i.e., the first segment is placed after the second segment).

In other embodiments, every odd number of scan chains in the first scan chain 400 is rearranged. Thus, the rearrangement of the subset of scan chains in the first scan chain 400 is non-limiting. Further, the reconfigured scan chains' segmentation into more than two segments is similarly contemplated in other embodiments. For example, a subset of scan chains in scan chain 400 may be segmented into M segments, where M is equal or greater than two, which may be rearranged based on a predetermined or adjustable basis to arrive at the second scan chain 450.

Figure 5:
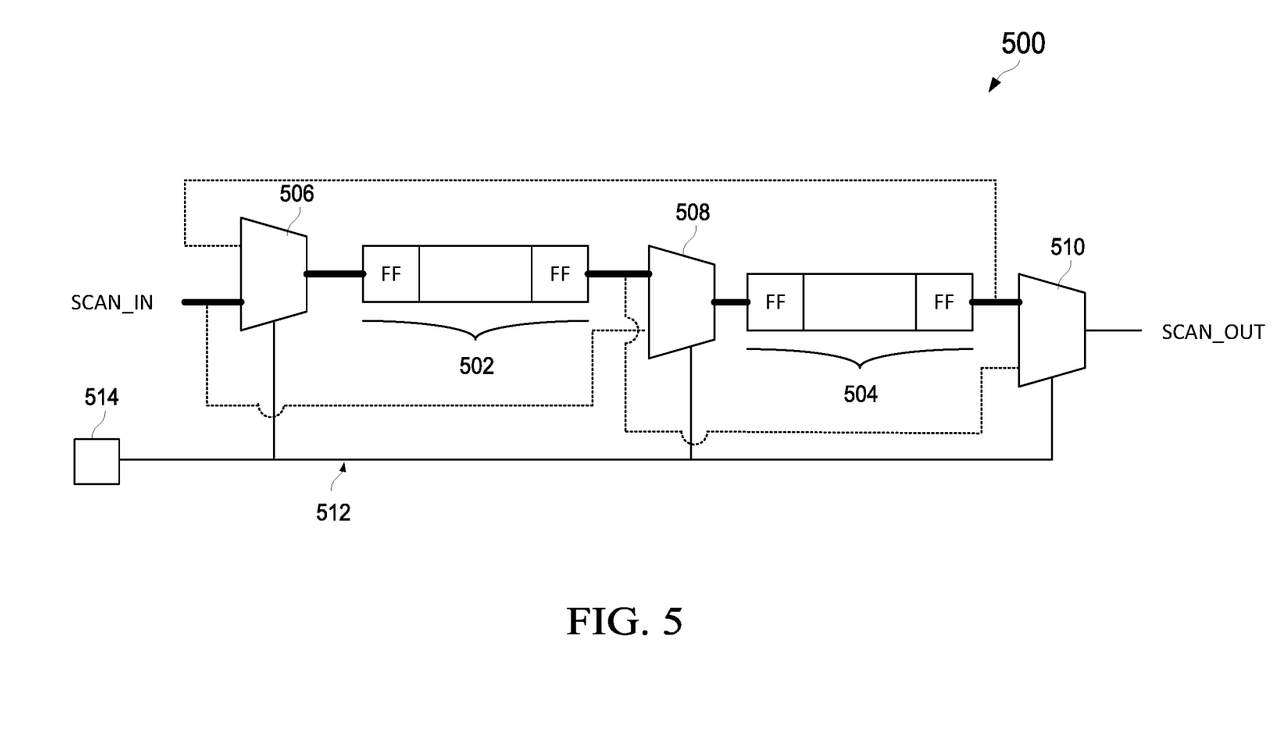
FIG. 5 is a block diagram of an embodiment reconfigurable scan chain.

FIG. 5 illustrates a block diagram of an embodiment reconfigurable scan chain 500. Scan chain 500 includes a first segment 502, a second segment 504, a start-point multiplexer 506, a second multiplexer 508, and an end-point multiplexer 510, which may (or may not) be arranged as shown. Each alternate scan chain is reconfigured in embodiments, as shown in FIG. 5. In embodiments, the multiplexers are arranged at the segment boundaries (e.g., start, end, etc.)

In embodiments, scan chain 500 is segmented into two segments: (i) first segment 502 and (ii) second segment 504, where second segment 504 is a sequential segment to first segment 502. Start-point multiplexer 506 is arranged at the test scan entry, end-point multiplexer 510 is arranged at the test scan exit, and second multiplexer 508 is arranged at the end-point of the first segment 502 and the start-point of the second segment 504.

The "scan in" signal (SCAN_IN) is the input signal that loads test patterns into the scan chain 500. The "scan in" signal is used to shift-in the test patterns or test data into the scan chain 500 during the testing process. The normal operation is paused to test the circuit, and the circuit is put into "scan mode." In this mode, the scan chain 500 is activated, and the scan in signal is applied. The test patterns are serially loaded into the scan chain 500, one bit at a time, by shifting the data through the scan flip-flops. Each test pattern represents a specific set of input conditions designed to exercise various functionalities and paths in the circuit to ensure comprehensive testing. Once the test patterns are loaded into the scan chain, the circuit is switched back to "functional mode" for testing. The test patterns propagate through the combinational logic and sequential elements, and the corresponding outputs are shifted out of the scan chain using the "scan out" signal (SCAN_OUT) for analysis and comparison with the expected results.

A first terminal of the start-point multiplexer 506 and a first terminal of the second multiplexer 508 is coupled to the scan in signal (SCAN_IN). A second terminal of the start-point multiplexer 506 is coupled to the output of the second segment 504. A second terminal of the second multiplexer 508 is coupled to the output of the first segment 502. A first terminal of the end-point multiplexer 510 is coupled to the output of the first segment 502. A second terminal of the end-point multiplexer 510 is coupled to the output of the second segment 504.

Each of the start-point multiplexer 506, second multiplexer 508, and end-point multiplexer 510 includes a select terminal coupled to a select line 512, which receives a select signal from a common test point register 514. The test point register 514 is accessible to the test tool. It allows the test tool to forward the value at the first or second terminals of each of the start-point multiplexer 506, second multiplexer 508, and end-point multiplexer 510 to its corresponding output terminal, depending on the value of the select signal. It should be appreciated that using a common test point register 514 is non-limiting, and in other embodiments, additional test point registers may be used.

In the default configuration (denoted as the solid line between the components), the test tool sets the select signal to forward the test patterns to the first segment 502. The output of the first segment 502 is then forwarded to the input of the second segment 504. Finally, the resulting output from the second segment 504 is observed at the output of the scan chain 500.

In the reconfigured configuration (e.g., scan chain 452b) (denoted as the dashed line between the components), the test tool sets the select signals such that the test patterns are first forwarded to the second segment 504. The output of the second segment 504 is then forwarded to the input of the first segment 502. Finally, the resulting output from the first segment 502 is observed at the output of the scan chain 500.

It is noted that although the scan chain 500 is shown to have two segments, in other embodiments, the number of segments may be equal to M, where M is an integer greater than one. In such embodiments, the scan chain will include a start-point multiplexer, an end-point multiplexer, and a corresponding multiplexer (numbering M−1) at the end of each segment. The test tool is then configured to provide a select signal to the M+1 multiplexers to arrange the scan chain 500 in an appropriate reconfigured arrangement.

Figure 6:
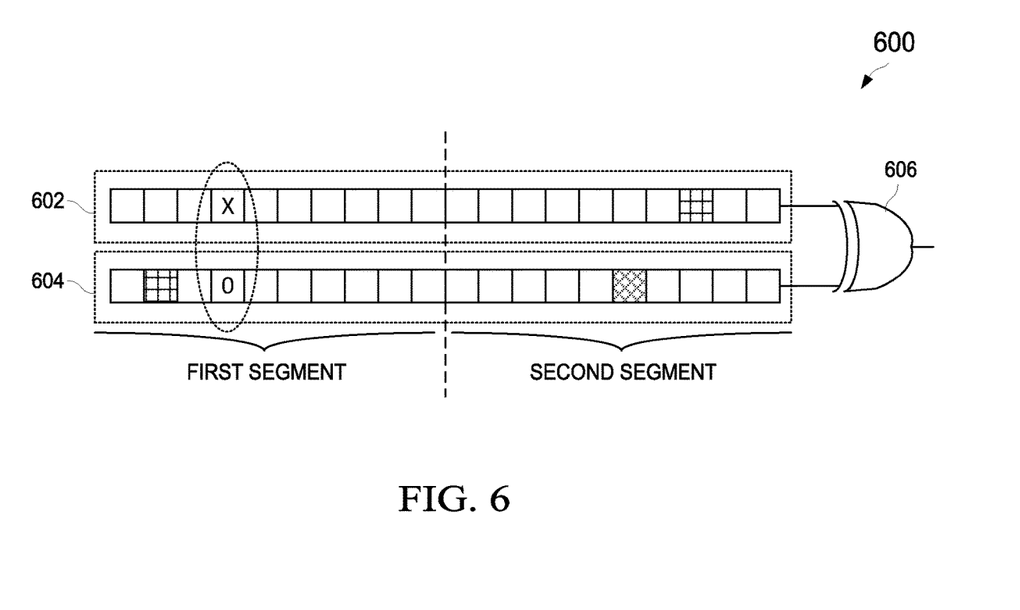
FIG. 6 is a block diagram of a first scan chain and a second scan chain compressed into a single output.

FIG. 6 illustrates a block diagram of a first scan chain 602 and a second scan chain 604 compressed into a single output. In certain situations, known a priori, when the response of the test pattern forwarded through the flip-flops of the scan chain in a circuit is observed or captured, the response is indeterminate. This indeterminate response may be the result of timing violations or the like. The indeterminate response is commonly referred to as "X," meaning we cannot deterministically state that the value is '0' or '1'. Generally, this indeterminate response is known when the test pattern is generated, and the test tool is aware that the response from the corresponding cycle does not need to be compared to an expected result.

A common issue arises when outputs of multiple scan chains are compressed by the compression circuit 108 or XOR-ed into a single pin. In such cases, valid data may be captured on the second scan chain 604 and X type-data on the first scan chain 602. The output of the compression or XOR operation is an X type because one of the inputs to the XOR logic gate 606 is indeterminate. Disadvantageously, valid data captured on the second scan chain 604 is, thus, masked due to the indeterminate data on the first scan chain 602.

Figure 7:
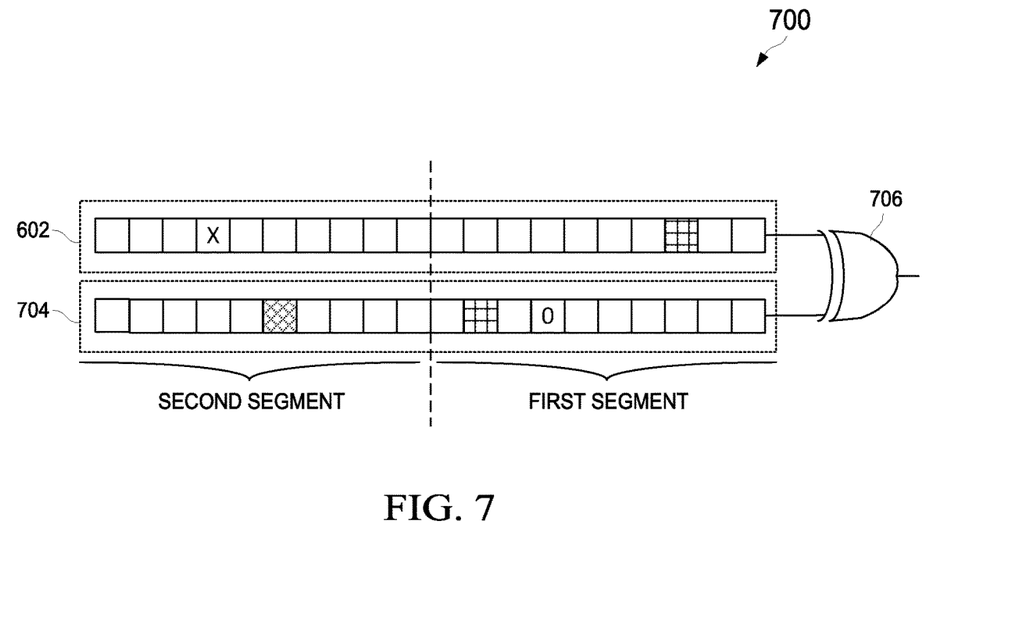
FIG. 7 is a block diagram of a first scan chain and a reconfigured second scan chain compressed into a single output.

FIG. 7 illustrates a block diagram of the first scan chain 602 and a reconfigured second scan chain 704 compressed into a single output. Advantageously, by reconfiguring the second scan chain 704 by (i) first segmenting the second scan chain 604 and (ii) swapping the segments of the second scan chain 604 to form the second scan chain 704, the location of the X type data relative to the second chain 604 is rearranged. As such, the cycle where the output of the first scan chain 602 is indeterminate is no longer in the same cycle as the valid output of the second chain 604. Advantageously, valid data captured on the second scan chain 704 is, thus, made available at the output of the XOR logic gate 706.

Advantageously, by segmenting the scan chains and swapping the position of the segments relative to each other, we benefit from (i) preventing different scan chains from driving a common combinational logic (i.e., improved controllability) and (ii) preventing masking of valid data from one scan chain when another scan chain has an indeterminate result (i.e., improved observability).

Figure 8:
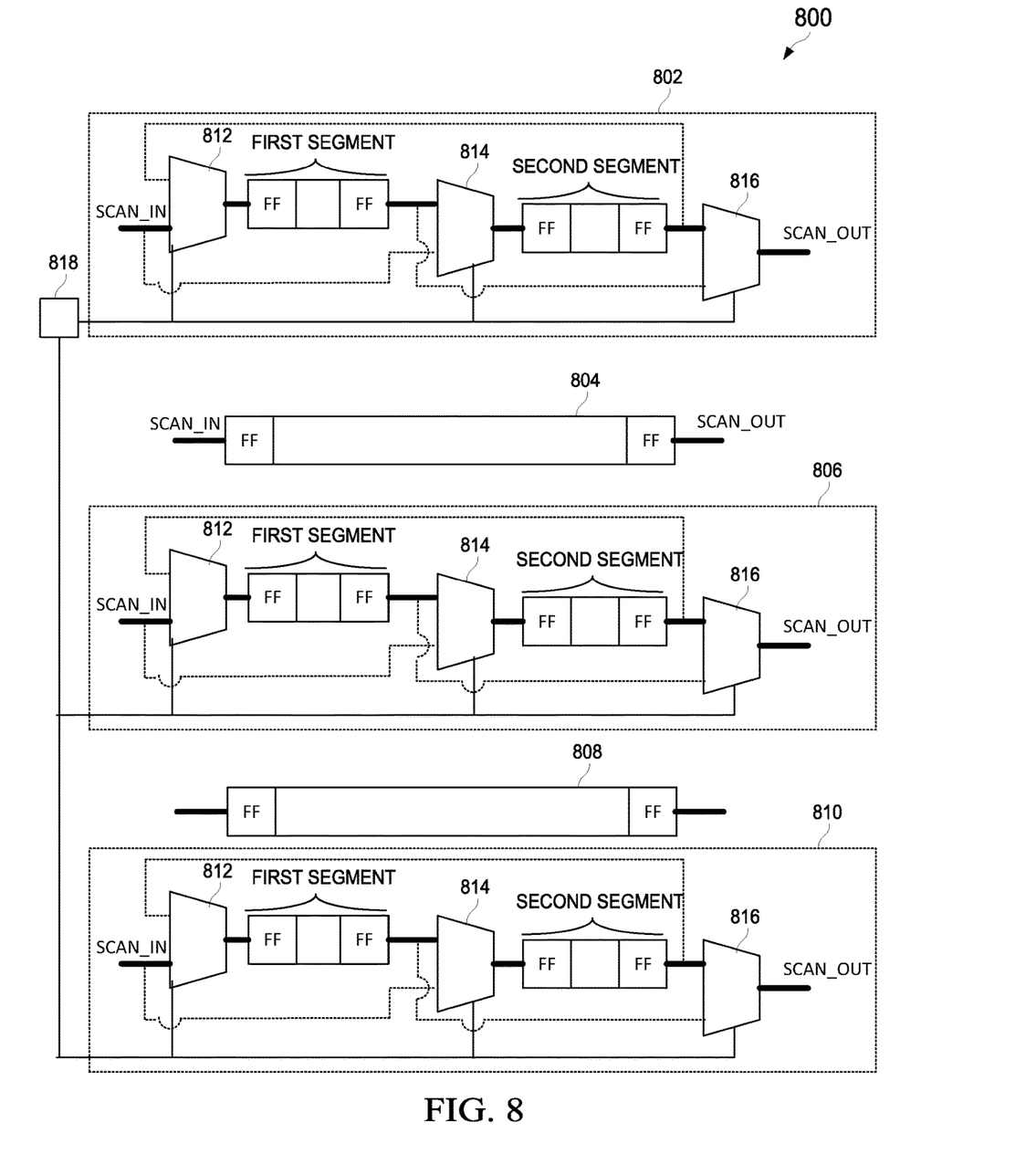
FIG. 8 is a block diagram of an embodiment corresponding to the dynamic reconfiguration of scan chains with a common test point register.

FIG. 8 illustrates a block diagram of an embodiment corresponding to the dynamic reconfiguration of scan chains 800, with a common test point register 818. As shown, the select terminal of the start-point multiplexer 812, second multiplexer 814, and end-point multiplexer 816 of all alternate scan chains (e.g., first scan chain 802, third scan chain 806, and fifth scan chain 810) are coupled to a common test point register 818. As shown, every other alternate scan chain (e.g., second scan chain 804 and fourth scan chain 808) is in the default configuration.

In embodiments, a test tool provides a select signal through the test point register 818 to reshuffle every alternate scan chain. In embodiments, the select signal is driven by a flip-flop. In embodiments, the flip-flop is part of a scan chain that holds a constant value during scan-shift. In embodiments, the test tool loads the test patterns for the scan chains. It simultaneously provides a select signal to the multiplexers to appropriately reconfigure select scan chains corresponding to the tested test pattern.

Advantageously, the test tool has the flexibility to rearrange select scan chains based on the test pattern by selecting the appropriate select signal. Thus, the test tool can intelligently rearrange select scan chains based on the test pattern.

Thus, FIG. 8 illustrates an embodiment where the scan chains to be reconfigured are controlled by a common test point register 818. The advantage of having a common test point register 818 is that it simplifies the test setup.

Figure 9:
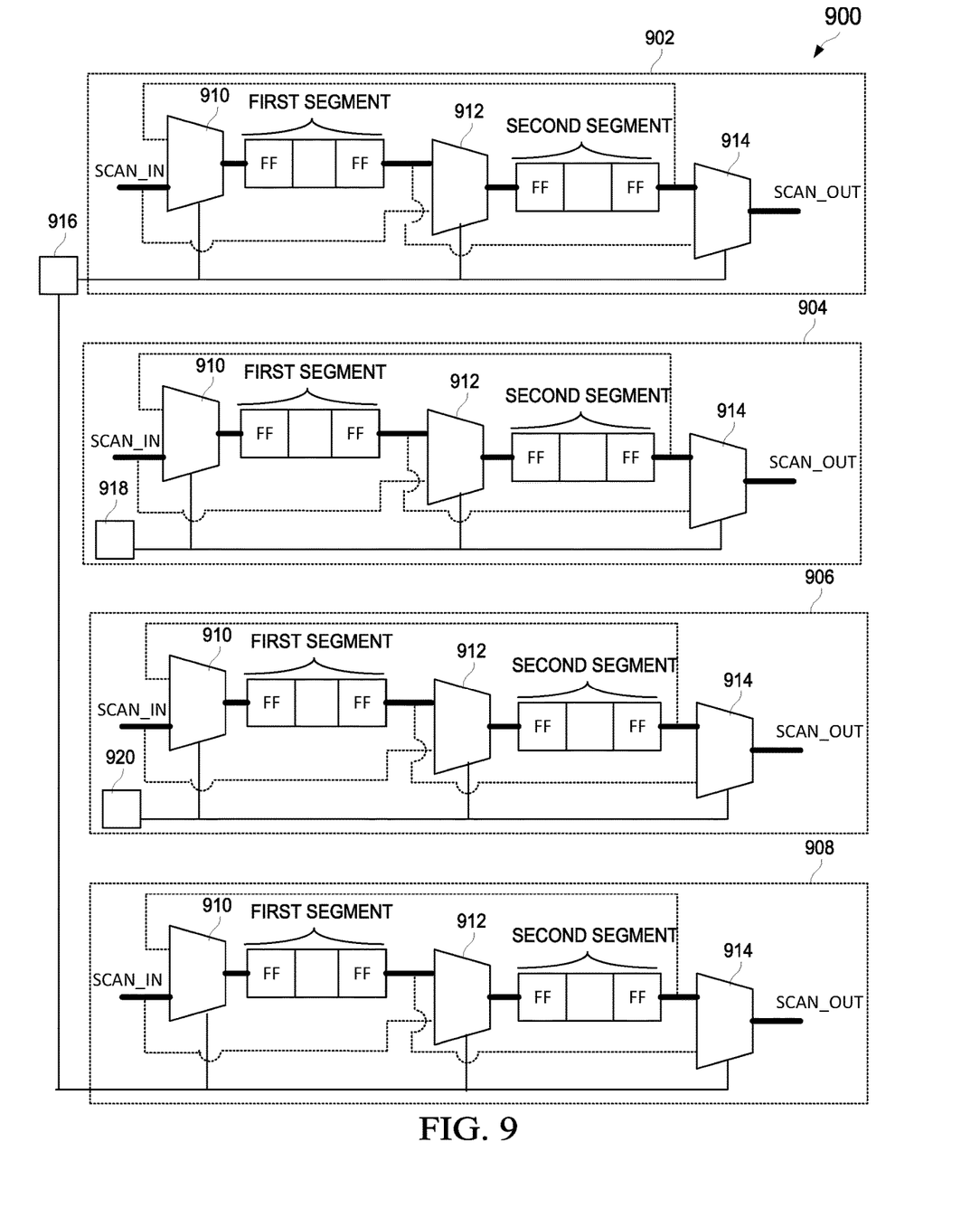
FIG. 9 is a block diagram of an embodiment corresponding to the dynamic reconfiguration of scan chains with multiple test point registers.

FIG. 9 illustrates a block diagram of an embodiment corresponding to the dynamic reconfiguration of scan chains 900, with multiple test point registers 916, 918, and 920. As shown, the select terminal of the start-point multiplexer 910, second multiplexer 912, and end-point multiplexer 914 of each scan chain is coupled to a corresponding test point register 916, 918, and 920.

In embodiments, the first scan chain 902 and the fourth scan chain 908 can be rearranged by selectively asserting a first select signal at a first test point register 916, second scan chain 904 can be rearranged by selectively asserting a second select signal at a second test point register 918, and third scan chain 906 can be rearranged by selectively asserting a third select signal at a third test point register 920.

In embodiments, rearranging each scan chain includes an independent test point register (e.g., second scan chain 904 and third scan chain 906). In embodiments, a subset of scan chains to be rearranged include a common test point register (e.g., first scan chain 902 and fourth scan chain 908).

Thus, as shown in FIGS. 8 and 9, implementing controllability via the test point registers in rearranging scan chains is non-limiting. In various embodiments, one, a subset, or all of the scan chains can be coupled to a test point register. In some embodiments, the test point registers are common to two or more scan chains. In some embodiments, each scan chain includes an independent test point register for controllability.

In embodiments, the test tool can selectively assert a select signal on the one or more test point registers, based on the desired configuration, and rearrange one or more scan chains to improve observability and controllability as discussed above.

In embodiments, the select signal asserted at the test point register is based on a static selection logic (i.e., the same select signal asserted for a test pattern to be tested). As such, the configuration does not suffer from timing issues, and no critical timing interface or critical timing paths are required to, for example, synchronize the select signal during the testing of the circuit based on the embodiments disclosed. It should be noted that the test tool may assert different select signals at the test point register for different test patterns; however, the select signal is not required to be modified while testing the circuit using a single test pattern.

In embodiments, the value of the select signal at one or more test point registers is determined by the test tool based on the test pattern In embodiments, the scan chain reordering can be performed between and across reconfigured segments. As the scan chains can run across flip-flops spread across the physical layout of the circuit under test, during the physical routing phase of the design for testing, the scan chains can be reordered. In embodiments, the scan chain reordering is based on the reconfigured scan chains, which can simplify the test flow.

In embodiments, the test tool generates a single set of test patterns that include a first test pattern based on the original arrangement of the scan chain and a second test pattern based on the reconfigured arrangement of select scan chains. The test tool can dynamically select between the first and second test patterns. In embodiments, the test tool can dynamically determine which of the first or second test patterns are to be used based on, for example, increased test coverage, test efficiency, or the like, by loading the test points with appropriate data during each pattern.

Figure 10:
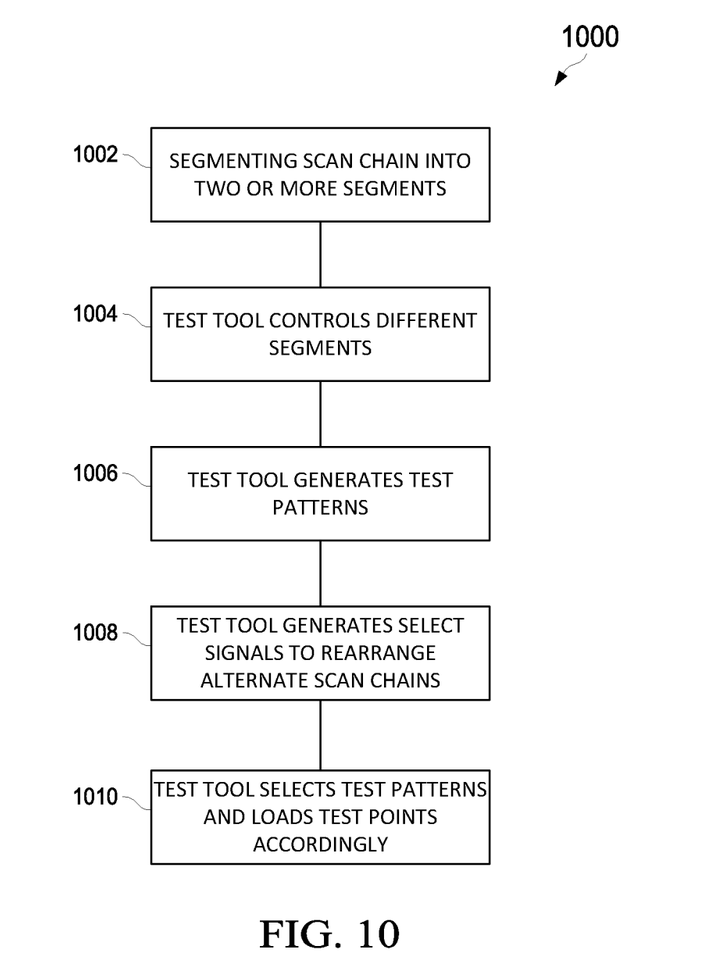
FIG. 10 is a flow chart of an embodiment method to implement a reconfigured scan chain, as disclosed herein.

FIG. 10 illustrates a flow chart of an embodiment method 1000 to implement a reconfigured scan chain, as disclosed herein. Although the method described below applies to a single scan chain, it should be understood that it can be expanded to two or more scan chains. In embodiments, each alternate scan chain coupled to a common compression and decompression circuit is arranged as described herein. In embodiments, the test patterns are provided by the test tool. In other embodiments, the test patterns are provided by an LBIST controller.

At step 1002, a scan chain is segmented into two or more segments. In embodiments, the segments have the same length. In embodiments, the segments have different lengths. In embodiments, the scan chain is segmented into two segments of equal length. In embodiments, every other scan chain (i.e., alternate scan chains) is segmentized. A respective multiplexer is arranged at the endpoints of each scan chain segment. For example, in a scan chain with two segments, a start-point multiplexer 506 includes a first input configured to receive a test pattern. The start-point multiplexer 506 output is coupled to the first scan chain segment input. A second input of the start-point multiplexer 506 is coupled to the output of the second segment sequential to the first segment. The output of the first segment is coupled to a first input of a second multiplexer 508. A second multiplexer 508 output is coupled to the second scan chain segment input. A second input of the second multiplexer 508 is configured to receive the test pattern. An end-point multiplexer 510 is configured to have a first input coupled to the output of the second segment and a second input coupled to the output of the first segment. The output of the end-point multiplexer 510.

At step 1004, the test tool controls different segments with multiple test points.

At step 1006, the test tool generates a single test pattern that includes (i) a first test pattern associated with an original configuration of the scan chain, which corresponds to the second segment following the first segment and (ii) a second test pattern is associated with a reconfigured scan chain, corresponding to the first segment following the second segment.

At step 1008, the test tool generates a select signal at a test point register coupled to a select signal of a test point register coupled to a select terminal of the start-point multiplexer 506, the second multiplexer 508, and the end-point multiplexer 510. The test tool dynamically selects which input of a respective multiplexer is forwarded to its output by asserting the select signal. In embodiments, each test point register is associated with a respective multiplexer. In embodiments, a test point register is common to all multiplexers in the scan chain to be reconfigured. In embodiments, the test tool generates a respective select signal to each test point register. In embodiments, different scan chains may share a common test point register. In other embodiments, different scan chains may have different test point registers.

At step 1010, the test tool selects between one of the first or second patterns of the single test patterns and the select signal based on the arrangement of the scan chain. The output signal at the end-point multiplexer 510 is observed and compared to the expected result to determine faults in the scan chain.

It is noted that all steps outlined in the flow chart are not necessarily required and can be optional. Further, changes to the arrangement of the steps, removal of one or more steps and path connections, and addition of steps and path connections are similarly contemplated.

A first aspect relates to a method for testing a scan chain. The method includes segmenting the scan chain into two or more segments; adding a respective multiplexer at end points of each segment, wherein each pair of sequential segment shares a common multiplexer in between; asserting a select signal at a select terminal of the multiplexers such that a relative position of the two or more segments is rearranged positionally in a rearranged scan chain; generating a test pattern to be communicated to an input terminal of the rearranged scan chain and observing a test result at an output of the rearranged scan chain; and determining a fault condition in the rearranged scan chain based on comparing the test result and an expected result.

In a first implementation form of the method according to the first aspect as such, the scan chain is segmented into a first segment and a second segment sequential to each other. In the rearranged scan chain, a position of the first segment sequentially follows a position of the second segment.

In a second implementation form of the method according to the first aspect as such or any preceding implementation form of the first aspect, the first segment and the second segment are of equal length.

In a third implementation form of the method according to the first aspect as such or any preceding implementation form of the first aspect, the scan chain is a first scan chain. The method further includes retaining an original configuration of a second scan chain adjacent to the first scan chain in response to the first scan chain being rearranged.

In a fourth implementation form of the method according to the first aspect as such or any preceding implementation form of the first aspect, the select signal is a first select signal. The method further includes segmenting a third scan chain adjacent to the second scan chain into two or more segments; adding a multiplexer at the end points of each segment of the third scan chain, wherein each sequential segment of the third scan chain shares a common multiplexer in between; asserting a second select signal at a select terminal of the one or more multiplexers in the third scan chain such that a relative position of the two or more segments of the third scan chain are rearranged positionally in a rearranged third scan chain; generating a second test pattern to be communicated to an input terminal of the rearranged third scan chain and observing a test result at an output of the rearranged third scan chain; and determining a fault condition in the rearranged third scan chain based on a comparison between the test result and an expected result for the rearranged third scan chain.

In a fifth implementation form of the method according to the first aspect as such or any preceding implementation form of the first aspect, the first select signal and the second select signal are the same select signal and asserted at a common test point register.

In a sixth implementation form of the method according to the first aspect as such or any preceding implementation form of the first aspect, the first scan chain, the second scan chain, and the third scan chain share a common compression circuit, a common decompression circuit, a common combinational logic, or a combination thereof.

A second aspect relates to a scan chain that includes a plurality of sequential segments and a plurality of multiplexers. Each multiplexer is arranged at the end points of each segment. Each pair of sequential segment shares a common multiplexer in between. Each multiplexer is configured to receive a select signal such that a relative position of each sequential segment is rearranged positionally in a rearranged scan chain. A test pattern is fed to an input terminal of the rearranged scan chain and a test result is observed at an output of the rearranged scan chain. A fault condition is determined in the rearranged scan chain based on a comparison between the test result and an expected result.

In a first implementation form of the scan chain according to the second aspect as such, the scan chain is segmented into a first segment and a second segment sequential to each other. In the rearranged scan chain, a position of the first segment sequentially follows a position of the second segment.

In a second implementation form of the scan chain according to the second aspect as such or any preceding implementation form of the second aspect, the first segment and the second segment are of equal length.

In a third implementation form of the scan chain according to the second aspect as such or any preceding implementation form of the second aspect, a first input terminal of a first multiplexer is configured to receive a test pattern. A second input terminal of the first multiplexer is configured to receive an output signal from the second segment. An output terminal of the first multiplexer is fed to the first segment. A first input terminal of a second multiplexer is configured to receive an output signal from the first segment. A second input terminal of the second multiplexer is configured to receive a test pattern. An output terminal of the second multiplexer is fed to the second segment. A first input terminal of a third multiplexer is configured to receive an output signal from the first segment, a second input terminal of the third multiplexer is configured to receive an output signal from the second segment, and an output terminal of the third multiplexer is observed to determine the fault condition.

In a third implementation form of the scan chain according to the second aspect as such or any preceding implementation form of the second aspect, the scan chain is a first scan chain. A second scan chain adjacent to the first scan chain retains an original configuration in response to the first scan chain being rearranged.

In a fourth implementation form of the scan chain according to the second aspect as such or any preceding implementation form of the second aspect, the select signal is a first select signal. A third scan chain shares a common compression circuit, a common decompression circuit, a common combinational logic, or a combination thereof, with the first scan chain and the second scan chain. The third scan chain includes a second plurality of sequential segments and a second plurality of multiplexers. Each multiplexer in the second plurality of multiplexers is arranged at end points of each segment in the second plurality of sequential segments. Each pair of sequential segments in the second plurality of sequential segments shares a common multiplexer in between. Each multiplexer in the second plurality of multiplexers is configured to receive a second select signal such that a relative position of each sequential segment in the second plurality of sequential segments is rearranged positionally in a second rearranged scan chain. A second test pattern is fed to an input terminal of the second rearranged scan chain and a second test result is observed at an output of the second rearranged scan chain. A second fault condition is determined in the second rearranged scan chain based on a comparison between the second test result and a second expected result.

In a fifth implementation form of the scan chain according to the second aspect as such or any preceding implementation form of the second aspect, the first select signal and the second select signal are the same select signal and asserted at a common test point register.

A third aspect relates to a test system. The test system includes a plurality of scan chains. Each alternate scan chain in the plurality of scan chains includes a plurality of sequential segments and a plurality of multiplexers. Each multiplexer is arranged at the end points of each segment. Each pair of sequential segment shares a common multiplexer in between. Each multiplexer is configured to receive a select signal such that a relative position of each sequential segment is rearranged positionally in a rearranged scan chain. A test pattern is fed to an input terminal of the rearranged scan chain and a test result is observed at an output of the rearranged scan chain. A fault condition is determined in the rearranged scan chain based on a comparison between the test result and an expected result.

In a first implementation form of the test system according to the third aspect as such, the test system includes a compression circuit, a decompression circuit, and a combinational logic. The scan chains in the plurality of scan chains are configured to receive a test signal via the decompression circuit and output a test result via the compression circuit. Two or more scan chains in the plurality of scan chains drive the combinational logic.

In a second implementation form of the test system according to the third aspect as such or any preceding implementation form of the third aspect, in a non-rearranged configuration of each alternate scan chain, at least one pair of adjacent scan chains drive the common combinational logic at the same shift cycle. In the rearranged configuration of each alternate scan chain, the at least one pair of adjacent scan chains drive the common combinational logic at different shift cycles.

In a third implementation form of the test system according to the third aspect as such or any preceding implementation form of the third aspect, each scan chain is segmented into a first segment and a second segment sequential to each other. In each rearranged scan chain, a position of an associated first segment sequentially follows a position of an associated second segment.

In a fourth implementation form of the test system according to the third aspect as such or any preceding implementation form of the third aspect, in each alternate scan chain, a first input terminal of each first multiplexer is configured to receive a test pattern, a second input terminal of the each first multiplexer is configured to receive an output signal from the second segment, and an output terminal of the each first multiplexer is fed to the first segment. A first input terminal of each second multiplexer is configured to receive an output signal from the first segment, a second input terminal of each second multiplexer is configured to receive a test pattern, and an output terminal of each second multiplexer is fed to the second segment. A first input terminal of each third multiplexer is configured to receive an output signal from the first segment, a second input terminal of each third multiplexer is configured to receive an output signal from the second segment, and an output terminal of each third multiplexer is observed to determine the fault condition.

In a fifth implementation form of the test system according to the third aspect as such or any preceding implementation form of the third aspect, a select terminal of each multiplexer is coupled to a common test point register.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for testing a scan chain, the method comprising:
    segmenting the scan chain into two or more segments;
    adding a respective multiplexer at end points of each segment, wherein each pair of sequential segment shares a common multiplexer in between;
    asserting a select signal at a select terminal of the multiplexers such that a relative position of the two or more segments is rearranged positionally in a rearranged scan chain;
    generating a test pattern to be communicated to an input terminal of the rearranged scan chain and observing a test result at an output of the rearranged scan chain; and
    determining a fault condition in the rearranged scan chain based on comparing the test result and an expected result.

2. The method of claim 1, wherein the scan chain is segmented into a first segment and a second segment sequential to each other, and wherein, in the rearranged scan chain, a position of the first segment sequentially follows a position of the second segment.

3. The method of claim 2, wherein the first segment and the second segment are of equal length.

4. The method of claim 1, wherein the scan chain is a first scan chain, the method further comprising retaining an original configuration of a second scan chain adjacent to the first scan chain in response to the first scan chain being rearranged.

5. The method of claim 4, wherein the select signal is a first select signal, the method further comprising:
   segmenting a third scan chain adjacent to the second scan chain into two or more segments;
   adding a multiplexer at end points of each segment of the third scan chain, wherein each sequential segment of the third scan chain shares a common multiplexer in between;
   asserting a second select signal at a select terminal of the one or more multiplexers in the third scan chain such that a relative position of the two or more segments of the third scan chain are rearranged positionally in a rearranged third scan chain;
   generating a second test pattern to be communicated to an input terminal of the rearranged third scan chain and observing a test result at an output of the rearranged third scan chain; and
   determining a fault condition in the rearranged third scan chain based on a comparison between the test result and an expected result for the rearranged third scan chain.

6. The method of claim 5, wherein the first select signal and the second select signal are the same select signal and asserted at a common test point register.

7. The method of claim 5, wherein the first scan chain, the second scan chain, and the third scan chain share a common compression circuit, a common decompression circuit, a common combinational logic, or a combination thereof.

8. A scan chain, comprising:
   a plurality of sequential segments; and
   a plurality of multiplexers, each multiplexer arranged at end points of each segment, wherein each pair of sequential segment shares a common multiplexer in between, each multiplexer configured to receive a select signal such that a relative position of each sequential segment is rearranged positionally in a rearranged scan chain,
   wherein a test pattern is fed to an input terminal of the rearranged scan chain and a test result is observed at an output of the rearranged scan chain, and
   wherein a fault condition is determined in the rearranged scan chain based on a comparison between the test result and an expected result.

9. The scan chain of claim 8, wherein the scan chain is segmented into a first segment and a second segment sequential to each other, and wherein, in the rearranged scan chain, a position of the first segment sequentially follows a position of the second segment.

10. The scan chain of claim 9, wherein the first segment and the second segment are of equal length.

11. The scan chain of claim 9, wherein a first input terminal of a first multiplexer is configured to receive a test pattern, a second input terminal of the first multiplexer is configured to receive an output signal from the second segment, and an output terminal of the first multiplexer is fed to the first segment, wherein a first input terminal of a second multiplexer is configured to receive an output signal from the first segment, a second input terminal of the second multiplexer is configured to receive a test pattern, and an output terminal of the second multiplexer is fed to the second segment, and wherein a first input terminal of a third multiplexer is configured to receive an output signal from the first segment, a second input terminal of the third multiplexer is configured to receive an output signal from the second segment, and an output terminal of the third multiplexer is observed to determine the fault condition.

12. The scan chain of claim 8, wherein the scan chain is a first scan chain, and wherein a second scan chain adjacent to the first scan chain retains an original configuration in response to the first scan chain being rearranged.

13. The scan chain of claim 12, wherein the select signal is a first select signal, wherein a third scan chain shares a common compression circuit, a common decompression circuit, a common combinational logic, or a combination thereof, with the first scan chain and the second scan chain, and wherein the third scan chain comprises:
   a second plurality of sequential segments; and
   a second plurality of multiplexers, each multiplexer in the second plurality of multiplexers is arranged at end points of each segment in the second plurality of sequential segments, wherein each pair of sequential segments in the second plurality of sequential segments shares a common multiplexer in between, each multiplexer in the second plurality of multiplexers is configured to receive a second select signal such that a relative position of each sequential segment in the second plurality of sequential segments is rearranged positionally in a second rearranged scan chain,
   wherein a second test pattern is fed to an input terminal of the second rearranged scan chain and a second test result is observed at an output of the second rearranged scan chain, and
   wherein a second fault condition is determined in the second rearranged scan chain based on a comparison between the second test result and a second expected result.

14. The scan chain of claim 13, wherein the first select signal and the second select signal are the same select signal and asserted at a common test point register.

15. A test system, comprising:
   a plurality of scan chains, wherein each alternate scan chain in the plurality of scan chains comprises:
      a plurality of sequential segments, and
      a plurality of multiplexers, each multiplexer arranged at end points of each segment, wherein each pair of sequential segment shares a common multiplexer in between, each multiplexer configured to receive a select signal such that a relative position of each sequential segment is rearranged positionally in a rearranged scan chain,
      wherein a test pattern is fed to an input terminal of the rearranged scan chain and a test result is observed at an output of the rearranged scan chain, and
      wherein a fault condition is determined in the rearranged scan chain based on a comparison between the test result and an expected result.

16. The test system of claim 15, further comprising a compression circuit, a decompression circuit, and a combinational logic, wherein the scan chains in the plurality of scan chains are configured to receive a test signal via the decompression circuit and output a test result via the compression circuit, and wherein two or more scan chains in the plurality of scan chains drive the combinational logic.

17. The test system of claim 16, wherein, in a non-rearranged configuration of each alternate scan chain, at least one pair of adjacent scan chains drive the common combinational logic at the same shift cycle, and wherein, in the rearranged configuration of each alternate scan chain, the at least one pair of adjacent scan chains drive the common combinational logic at different shift cycles.

18. The test system of claim 15, wherein each scan chain is segmented into a first segment and a second segment sequential to each other, and wherein, in each rearranged scan chain, a position of an associated first segment sequentially follows a position of an associated second segment.

19. The test system of claim 18, wherein, in each alternate scan chain, a first input terminal of each first multiplexer is configured to receive a test pattern, a second input terminal of the each first multiplexer is configured to receive an output signal from the second segment, and an output terminal of the each first multiplexer is fed to the first segment, wherein a first input terminal of each second multiplexer is configured to receive an output signal from the first segment, a second input terminal of each second multiplexer is configured to receive a test pattern, and an output terminal of each second multiplexer is fed to the second segment, and wherein a first input terminal of each third multiplexer is configured to receive an output signal from the first segment, a second input terminal of each third multiplexer is configured to receive an output signal from the second segment, and an output terminal of each third multiplexer is observed to determine the fault condition.

20. The test system of claim 15, wherein a select terminal of each multiplexer is coupled to a common test point register.

* * * * *